US011211796B2

(12) United States Patent
Metcalfe et al.

(10) Patent No.: US 11,211,796 B2
(45) Date of Patent: Dec. 28, 2021

(54) METHOD AND SYSTEM FOR LOCALLY CONTROLLING POWER DELIVERY ALONG A DISTRIBUTION FEEDER OF AN ELECTRICITY GRID

(71) Applicant: Enbala Power Networks Inc., North Vancouver (CA)

(72) Inventors: Malcolm S. Metcalfe, Westbank (CA); Severin Nowak, Kelowna (CA)

(73) Assignee: Power Management Holdings (U.S.), Inc., Wilmington, DE (US)

( * ) Notice: Subject to any disclaimer, the term of this patent is extended or adjusted under 35 U.S.C. 154(b) by 0 days.

(21) Appl. No.: 16/620,195

(22) PCT Filed: Jun. 5, 2018

(86) PCT No.: PCT/CA2018/050670
§ 371 (c)(1),
(2) Date: Dec. 6, 2019

(87) PCT Pub. No.: WO2018/223228
PCT Pub. Date: Dec. 13, 2018

(65) Prior Publication Data
US 2021/0083477 A1 Mar. 18, 2021

Related U.S. Application Data

(60) Provisional application No. 62/517,044, filed on Jun. 8, 2017.

(51) Int. Cl.
*H02J 1/12* (2006.01)
*H02J 3/02* (2006.01)
(Continued)

(52) U.S. Cl.
CPC ............ *H02J 3/16* (2013.01); *G01R 19/2513* (2013.01); *G01R 29/18* (2013.01); *H02J 3/1842* (2013.01);
(Continued)

(58) Field of Classification Search
CPC ...... H02J 3/16; H02J 13/00034; H02J 3/1842; H02J 3/381; H02J 2300/28;
(Continued)

(56) References Cited

U.S. PATENT DOCUMENTS 9,762,087 B2 9/2017 Metcalfe et al.
10,044,188 B2 8/2018 Metcalfe
(Continued)

FOREIGN PATENT DOCUMENTS

CA 2931266 A1 5/2015
CA 2 984 385 A1 11/2016
(Continued)

OTHER PUBLICATIONS

Cagano et al., "Centralized voltage control for distribution networks with embedded PV systems," *Renewable Energy*, vol. 76, pp. 176-185, Nov. 26, 2014.
(Continued)

*Primary Examiner* — Richard Tan
(74) *Attorney, Agent, or Firm* — Klarquist Sparkman, LLP

(57) ABSTRACT

A method and system for locally controlling delivery of electrical power along a distribution feeder. For a feeder segment in the distribution feeder the method includes: obtaining an actual voltage magnitude at an upstream node and at a downstream node of the feeder segment, and a real power value at the upstream node; setting a target voltage phasor at the downstream node as a value when a power flow across the feeder segment is maintained, and when equal (Continued)

reactive power is injected at the upstream and downstream nodes that consumes all the reactive power in the feeder segment; and adjusting operation of the at least one controllable reactive power resource so that the actual voltage magnitude at the downstream node moves towards a target voltage magnitude of the target voltage phasor.

12 Claims, 4 Drawing Sheets

(51) Int. Cl.
  H02J 3/38       (2006.01)
  H02J 3/16       (2006.01)
  H02J 13/00      (2006.01)
  G01R 19/25      (2006.01)
  G01R 29/18      (2006.01)
  H02J 3/18       (2006.01)
  H02S 50/00      (2014.01)
(52) U.S. Cl.
  CPC ........ *H02J 3/381* (2013.01); *H02J 13/00034* (2020.01); *H02S 50/00* (2013.01); *H02J 2300/28* (2020.01)
(58) Field of Classification Search
  CPC ..... G01R 19/2513; G01R 29/18; H02S 50/00; Y02E 40/30; Y02E 40/20; Y02E 10/50
  USPC ........................................................ 307/31
  See application file for complete search history.

(56) References Cited

U.S. PATENT DOCUMENTS

| | | | |
|---|---|---|---|
| 10,367,354 | B2 | 7/2019 | Tyler et al. |
| 2011/0178643 | A1 | 7/2011 | Metcalfe |
| 2012/0033473 | A1 | 2/2012 | Scharf |
| 2013/0030597 | A1 | 1/2013 | Milosevic et al. |
| 2013/0193951 | A1 | 8/2013 | Korovin |
| 2014/0375472 | A1 | 12/2014 | Sankey |
| 2015/0280435 | A1 | 10/2015 | Metcalfe et al. |
| 2016/0099607 | A1 | 4/2016 | Landis |
| 2016/0313197 | A1 | 10/2016 | Acharya |
| 2017/0110979 | A1 | 4/2017 | Chang et al. |
| 2017/0307676 | A1 | 10/2017 | Gaouda et al. |
| 2017/0371306 | A1 | 12/2017 | Sossan et al. |
| 2018/0095123 | A1 | 4/2018 | Biswas et al. |
| 2018/0131188 | A1 | 5/2018 | Metcalfe |
| 2018/0226799 | A1 | 8/2018 | Baker et al. |
| 2019/0363543 | A1 | 11/2019 | Shariatzadeh et al. |
| 2019/0369147 | A1 | 12/2019 | Liu et al. |
| 2020/0067314 | A1 | 2/2020 | Metcalfe et al. |
| 2020/0295564 | A1 | 9/2020 | Metcalfe et al. |

FOREIGN PATENT DOCUMENTS

| | | |
|---|---|---|
| CA | 2786720 C | 9/2018 |
| CN | 104 300 552 A | 1/2015 |
| CN | 106 655 207 A | 5/2017 |
| EP | 2788832 B1 | 10/2014 |
| WO | WO2011/085477 A1 | 1/2011 |
| WO | WO 2013/086238 A1 | 6/2013 |
| WO | WO2016/176775 A1 | 11/2016 |

OTHER PUBLICATIONS

Extended European Search Report and Opinion issued in European Patent Application No. 18814399.4, dated Feb. 12, 2021, 8 pages.
Mahmud et al., "Review of control strategies for voltage regulation of the smart distribution network with high penetration of renewable distributed generation," *Renewable and Sustainable Energy Reviews*, vol. 64, pp. 582-595, Jul. 8, 2016.
International Search Report and Written Opinion of the International Searching Authority, dated Jul. 17, 2018, for corresponding International Application No. PCT/CA2018/050670, 8 pages.
Schweitzer et al., "Real-Time Power System Control Using Synchrophasors," 2008 $61^{st}$ Annual conference for Protective Relay Engineers, College Station, Texas, 2008, pp. 78-88.
Schweitzer et al., "Synchrophasor-based power system protection and control applications," 2010 63rd Annual conference for Protective Relay Engineers, College Station, Texas, 2010, pp. 1-10.
International Search Report and Written Opinion for International Application No. PCT/US2019/056000, dated Dec. 10, 2019, 14 pages.
International Search Report and Written Opinion issued in International Publication No. PCT/IB2020/052326, dated May 29, 2020, 13 pages.

METHOD AND SYSTEM FOR LOCALLY CONTROLLING POWER DELIVERY ALONG A DISTRIBUTION FEEDER OF AN ELECTRICITY GRID

CROSS REFERENCE TO RELATED APPLICATIONS

This is the U.S. National Stage of International Application No. PCT/CA2018/050670, filed Jun. 5, 2018, which in turn claims the benefit of U.S. Provisional Application No. 62/517,044, filed Jun. 8, 2017. The provisional application is incorporated herein in its entirety.

FIELD

This disclosure relates generally to a method and system for locally controlling power delivery along a distribution feeder of an electricity grid.

BACKGROUND

The design of electrical power distribution infrastructure ("electricity grid") has evolved over decades to ensure that the electrical power that customers receive meet certain quality standards relating to voltage, frequency, and reliability.

In recent years, an increased penetration of solar power and other intermittent power generation sources in the electricity grid are causing significant control problems. For example, connected solar capacity as low as 10% of peak capacity on a distribution feeder may result in voltage violations that are beyond ANSI-defined limits. This intermittent generation capacity must be balanced with either load or generation adjustments elsewhere on the electricity grid in order to maintain system frequency. Often, a generation facility used for balancing is located a significant distance from a feeder containing the intermittent generation source thus resulting in significant marginal power losses, which in some cases may exceed 30%.

Also, intermittent power generation tends to cause voltage changes that can result in poor customer power quality and excess wear on substation tap changers. These substation tap changers incur increased maintenance needs and failure rates resulting from increased use caused by the intermittency. To avoid conflict between utility voltage management systems and voltage regulation capability on solar inverters, as well as to avoid potential poor regulation caused by customer equipment, intermittent generator operators have been forbidden from regulating the system voltage (IEEE 1547 and California Rule 21). Instead, electrical utilities have been monitoring line voltages and installing some in line capability to manage voltage where needed. This approach tends to be slow in response time, and costly for the utility to implement. Conventional electrical distribution systems are not designed to accommodate the increasing amount of intermittent generation, and new solutions are sought to address these challenges.

There are optimal power flow (OPF) algorithms generally known in the art directed to minimizing loss or cost in an electrical distribution system. The prior art suggests a large number of optimization algorithms and relaxations which consider constraints such as generation limits, transmission thermal limits, bus voltage limits, number of switching operations etc. These algorithms tend to seek to solve the following non-linear power flow equations:

$$P_k = V_k \sum_{n=1}^{N} Y_{kn} V_n \cos(\delta_k - \delta_n - \theta kn) \quad (1)$$

$$Q_k = V_k \sum_{n=1}^{N} Y_{kn} V_n \sin(\delta_k - \delta_n - \theta kn) \quad (2)$$

where $P_k$ and $Q_k$ are real power (P) and reactive power (Q) delivered to bus k in a N bus system defined by $Y_{kn}$ (Ybus matrix of the system) and $V_k$, $\delta_k$ is the voltage magnitude and phase at bus k and $\theta_{kn}$ is the angle of the admittance $Y_{kn}$.

Known OPF approaches lead to complex optimization problems requiring high computational resources, which can result in relatively slow reaction by power control systems executing these algorithms.

As it is desirable to respond quickly to intermittent power generation in an electrical distribution system, it is desirable to provide a means for controlling power delivery in an electrical distribution system that improves on prior art approaches.

SUMMARY

According to one aspect, there is provided a method for locally controlling delivery of electrical power along a distribution feeder of an electricity grid, wherein the distribution feeder comprises a substation and a plurality of nodes, and the plurality of nodes comprises at least one controllable reactive power resource. For a feeder segment in the distribution feeder, the method comprises: obtaining an actual voltage magnitude at an upstream node and at a downstream node of the feeder segment, and a real power value at the upstream node; setting a target voltage phasor at the downstream node as a value when a power flow across the feeder segment is maintained, i.e. equal to the real power value at the upstream node, and when total reactive power injected at the upstream and downstream nodes collectively generates all reactive power consumed by the feeder segment; and adjusting operation of the at least one controllable reactive power resource so that the actual voltage magnitude at the downstream node moves towards a target voltage magnitude of the target voltage phasor. Adjusting the operation of the at least one controllable reactive power resource can comprise using a reactive power device that increases reactive power to increase the actual voltage magnitude and using a reactive power device that decreases reactive power to decrease the actual voltage magnitude.

The actual voltage magnitude at the upstream and downstream nodes can be obtained by measuring at the feeder segment.

The reactive power that is injected at each of the upstream and downstream nodes can be equal.

The plurality of nodes for each feeder segment can comprise at least one controllable real power resource, in which case the method further comprises: measuring an actual voltage phasor value at the upstream and downstream nodes of the feeder segment, wherein the actual voltage phasor at the upstream and downstream nodes includes an actual voltage magnitude and an actual phase angle relative to the substation; and, adjusting operation of the at least one controllable real power resource so that the actual phase angle at the downstream node moves towards the target phase angle of the target voltage phasor.

The plurality of nodes can include a third node having an intermittent power generation source, in which case the method further comprises adjusting the target phasor setting at each node after a change in power generation from the intermittent power generation source.

According to another aspect, there is provided a system for locally controlling delivery of electrical power along a distribution feeder of an electricity grid. The distribution feeder comprises a substation and a plurality of nodes. A pair of adjacent nodes define a feeder segment of the distribution feeder and the feeder segment comprises at least one controllable reactive power resource. The system comprises: at least one reactive power resource controller communicative with and programmed to control operation of the at least one reactive power resource; and a server computer communicative with the at least one reactive power resource controller. The server computer comprises a processor and a memory having encoded thereon program code executable by the processor to:

(i) receive an actual voltage magnitude at an upstream node and at a downstream node of the feeder segment, and a real power value at the upstream node;

(ii) set a target voltage phasor at the downstream node as a value when a power flow across the feeder segment is equal to the real power value at the upstream node, and when total reactive power injected at the upstream and downstream nodes collectively generates all reactive power consumed by the feeder segment; and (iii) transmit the target voltage phasor to the at least one reactor power resource controller, such that the at least one reactive power resource controller operates the at least one controllable reactive power resource so that the actual voltage magnitude at the downstream node moves towards a target voltage magnitude of the target voltage phasor.

The system can further comprise at least one synchrophasor for measuring the actual phasor value at each node and which is communicative with the server computer to transmit a measured actual phasor value to the server computer.

DETAILED DESCRIPTION

Figure 1:
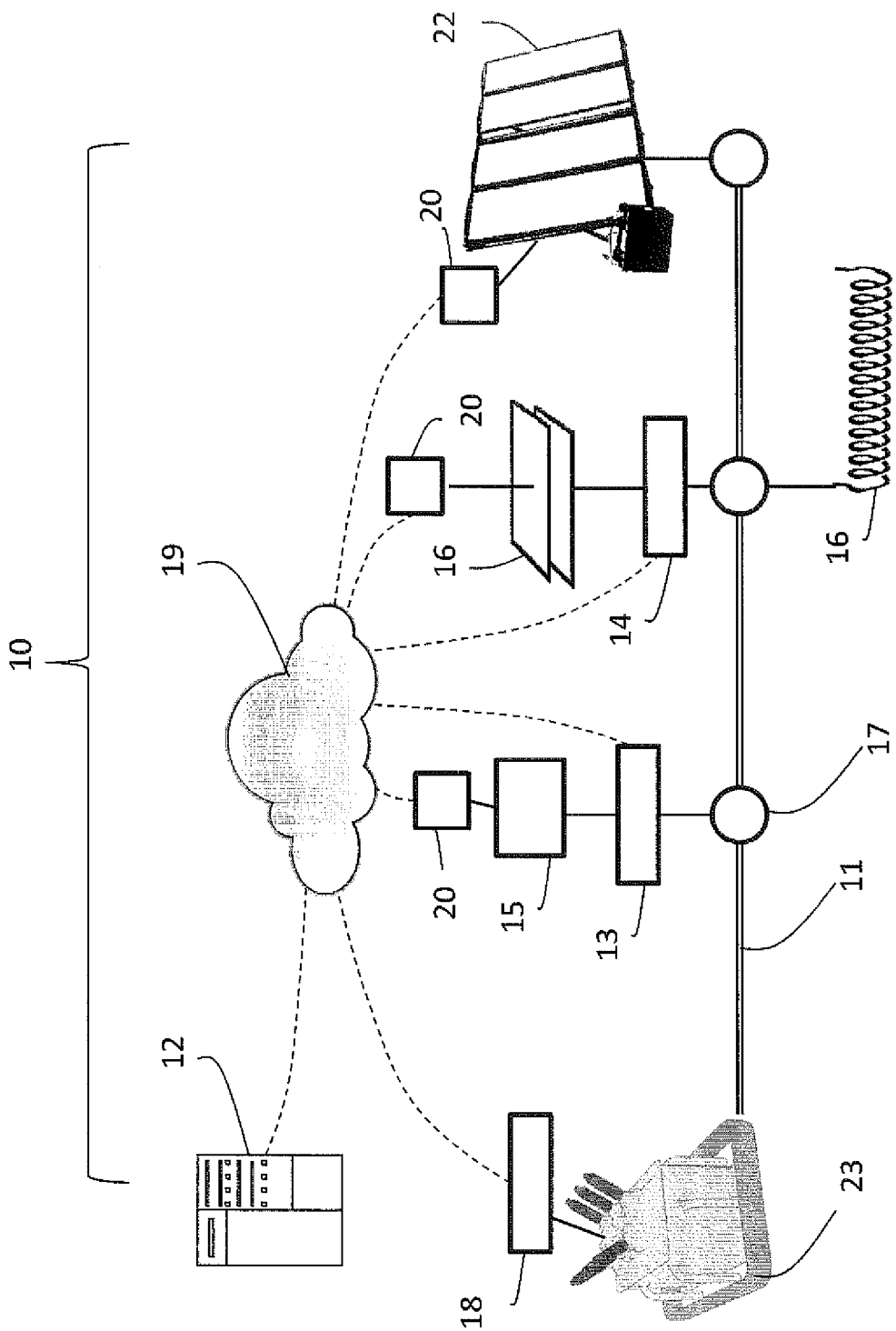
FIG. 1 is a block diagram of an apparatus for providing distributed control to resources on a distribution feeder of an electricity grid according to one embodiment.

Embodiments described herein relate generally to a method and system for locally controlling delivery of electrical power along a distribution feeder in an electricity grid (herein referred to as a "local power control method and system") in a manner that reduces power loss at one or more feeder segments of the distribution feeder. The distribution feeder comprises a substation and a plurality of nodes, wherein the substation comprises controllable voltage management devices such as tap changers (herein referred to as "utility voltage management devices") and at least some of the nodes comprise controllable reactive power resources, and optionally controllable real power resources. The system includes a server having a processor and a memory having encoded thereon a distributed power delivery control program, and controllers communicative with the server over a network. A controller is installed at each node having a controllable reactive power resource and at the substation; the system also includes a controller at each of the nodes having a controllable real power resource when such are present. Each controller is operable to control operation of the reactive and real power resources at the nodes and the utility voltage management devices at the substation. The control program when executed will set a target voltage phasor value at each node that comprises a target voltage magnitude and a target phase angle relative to the substation. The target voltage phasor at each node is selected such that the system delivers a target power flow along the distribution feeder, wherein the target power flow is based on reducing the line loss in each feeder segment by avoiding reactive power flow Q through each feeder segment, and maintaining equal real power flow P through each feeder segment. More particularly, the target power flow can be defined by two constraints, namely (1) the reactive power flow injected at an upstream node of a feeder segment and at a downstream node of the feeder segment collectively generates all reactive power consumed by the feeder segment, and (2) the total power flow through each feeder segment is only the real power flow. In some embodiments, the first constraint can be further defined to require the reactive power injected at the upstream and downstream nodes to be equal. The power delivery control program instructs the controllers installed at the reactive power resource nodes to control the operation of the reactive power resources so that the actual voltage magnitude of each node moves towards its target voltage magnitude. When real power resources are present, the power delivery control program can instruct the controllers installed at the real power resources nodes to control the operation of the real power resources so that the actual phase angle of each node moves towards its target phase angle. The actual phasor value at the upstream and downstream nodes of the feeder segment can be monitored by a synchrophaser to obtain actual voltage magnitude and actual phase angle (relative to the substation) values.

By controlling voltage levels locally using controllable real and reactive power resources, it is expected that feeder power losses will be reduced as the need for remotely located facilities to provide balancing is reduced, and voltage levels along the feeders is expected to fall within acceptable ranges (e.g. within ANSI defined limits) as voltage levels are firmed along the feeder. This can be particularly useful on feeders that contain an intermittent generation source such as a solar power plant, which can cause frequent voltage changes. Furthermore, by basing the target power flow on the two aforementioned constraints, a closed form solution can be provided for execution by the power delivery control program, which should be more computationally tractable than the complex optimization problems used in known OPF approaches, and thus enable the system to respond relatively quickly to changes in voltage levels along the distribution feeder.

System

According to one embodiment and referring to FIG. 1, a local power control system 10 for providing local control of power delivery along a distribution feeder 11 comprises a central server computer 12, controllers 13 for controlling real power resources 15, controllers 14 for controlling reactive power resources 16 along the feeder (respectively referred to as "real power resource controllers" 13 and "reactive power resource controllers" 14), and controllers 18 for controlling utility voltage management devices 23. The controllers 13, 14, 18 are communicative with the server computer 12 over a network 19 such as the Internet, either directly or with the addition of security tunnelling hardware or software; alternatively, the server computer 12 can be fitted with dedicated communication links to the controllers 13, 14, 18 such as Frame Relay.

The distribution feeder 11 comprises a plurality of node sites 17 ("nodes"), wherein some nodes 17 have one or more controllable reactive power resources 16, some nodes 17 have one or more controllable real power resources 15 and other nodes 17 have one or more non-controllable resources such as an intermittent power generation source 22. For the sake of simplicity, FIG. 1 illustrates a first node 17 having one controllable real power resource 15, a second node 17 having two controllable reactive power resources 16, namely a reactive power consuming device and a reactive power generating device, and a third node having a non-controllable solar power generation resource 22. The distribution feeder also comprises a substation comprising one or more tap changers 23 and/or other utility voltage management devices.

The real and reactive power resources 15, 16 are typically located along the node sites 17 at locations remote from the server computer 12. The real power resources 15 can be electrical generators having capacity to generate power ("generation resource"), electricity-powered devices having capacity to consume a load ("load resource"), and storage devices having capacity to store energy ("storage resource") for short periods and later release it back to the grid. Reactive power resources 16 that "generate" reactive power include capacitors, STATCOMs, solar (PV) inverters, and reactive power resources 16 that "consume" reactive power include solar (PV) inverters.

In this embodiment, the controllable real power resources 15 are all load resources, and in particular comprise multiple single-speed water pumps, analog electrical boilers, and analog electrical blowers. These real power-consuming load resources 15 are normally intended to serve a primary process other than providing local power control to a feeder (herein referred to as "process load resources"), and the power control system 10 is configured to operate these load resources 15 to provide local power control only within the operational constraints defined by the original primary processes of these process load resources 15. For example, the water pumps are used primarily to regulate the water level in a municipal water supply tank, each electrical boiler is used primarily to provide heat and domestic hot water for a building as part of a hybrid electric-gas heating system, and the blowers are used primarily to aerate a waste water treatment tank.

A load resource controller 13 is installed at the node site 17 of the process load resource 15 and communicates with the remotely-located server computer 12. As will be explained in detail below, each load resource controller 13 receives target phasor set-points from the server computer 12 comprising a target voltage magnitude and a target phase angle, and is programmed to operate the process load resource 15 at a load set-point that causes the actual phase angle at the node site 17 to be moved towards the target phase angle, but is also programmed to only operate the process load resource 15 when the load set-point is within the operational constraints of the process load resource 15 (typically defined by the load resource's own control system). In other words, the load resource controller 13 is programmed to allow the load resource's control system to override the load resource controller 13 when the operators of the primary process require the process load resource 15 to be used for its primary processes. For example, a municipal water plant operator may require that a water tank be kept between 10% and 90% full of water, and the load resource controller 13 is programmed to allow the server computer 12 to operate the pumps for this tank while the water level is within this range in order to provide local power control to the feeder 11. However, when the water level in the tank rises to 90% full, the load resource's control system will be allowed to turn the pumps on, even if the server computer 12 desires the pumps to be kept off. Controllable process load resources 15 which are being used at a given time to serve their primary process are considered to be "off-line" to the server computer 12 and not available to provide local power control; conversely, controllable load resources 15 which are within their primary operational constraints are considered "on-line" and available to be used to provide local power control. "Off-line" load resources 15 are compensated for by the server computer 12 with other "on-line" load resources 15 so that the overall power control functionality is preserved.

The load resource controller 13 in this embodiment is a small rugged computer with capability to connect to the Internet 19, and to connect to the load resources 15 at their respective resource node sites 17. The connection between the load resource controller 13 and the server computer 12 is achieved through the internet 19, using a secure means of communications. The load resource controller 13 is connected to the generation resource, load resource, or storage resource using one of a number of methods, including: direct wiring to controllers or governors of the load resource control system; direct connection to the Supervisory Control and Data Acquisition (SCADA) System used to control the process load resource 15 at the resource node site 17, or connection to the network 19 used by the control system at the node site 17 that controls the load resource 15. The real power resource controller 13 is also connected to metering devices (not shown) that measure, to revenue standards, the power being delivered or consumed by the process load resources 15.

The load resource controller 13 may be connected to additional measurement equipment (not shown) as required to ensure that operating constraints can be properly met, by: direct wiring to controllers or measurement equipment; direct connection to the SCADA System used to measure the process load resources 15 at the resource node site 17; or connection to a network 19 used by the load resource's control system at the node site 17 to measure the process load resource 15.

In operation, the load resource controller 13 will receive a target phasor signal from the server computer 12, directing a change in consumption or generation from one or more of the process load resources 15 at the node site 17. The real power resource controller 13 will validate the received signal against the operating constraints of the process load resource 15 and clamp the signal if required. The control system of the load resource 15 will send the set-point signal to the process load resource 15 identified by the server computer 12, commanding the requested change.

At every update interval (e.g. 2 seconds), the load resources controller 13 will send a series of signals to the server computer 12, specifically:

- The status or level of operation of each process load resource 15 at the resource node site 17 (there may be multiple load resources connected to each load resource control system). The load resource controller 13 will aggregate and send a total power signal to the server computer 12, reflecting the power generated or consumed at that site;
- The load resource controller 13 will send a separate signal to the server computer 12 to define the maximum and minimum power levels that are available for the existing process load resources 15 at the resource node site 17;

Any additional state information required by the server computer 12 to execute its costing subroutine, as will be described below; and An indicator if the load resource controller 13 itself, or the SCADA, or the load resource control system, has suspended server computer 12 control, and the current local control set-point if the server computer 12 control is suspended.

The load resource controller 13 will then store the command status and the power levels measured for every resource at the resource node site 17. Data storage at the local load resource controller 13 should be sufficient to maintain all records for an extended period of time, for example two years. The server computer 12 and the load resource 15 are time-synchronized so that all time-stamped communications between nodes 17 can be properly interpreted. The control and status protocol between the server computer 12 and the load resources 15 insures that network issues (e.g. packet loss or reordering), does not cause incorrect control actions. The system will run continuously, with an intended cycle time between the server computer 12 and the load resource controller 13 of about 5-10 seconds, and 5-60 seconds for larger systems. Local storage of data is maintained, time stamped in the revenue grade meters, in the server computer 12 and in the control system of the load resources 15.

Like the load resource controllers 13, the reactive power resource controllers 14 are located at each node site 17 of reactive power resources 16, and are operable to control the operation of those reactive power resources 16. The reactive power resource controller 14 has the same hardware design as the load resource controller, and is programmed to control the reactive power resources 16. Similarly, the utility resource controller 18 is of the same hardware design as the load and reactive power resource controllers 13, 14 with programming adapted to control the utility voltage management devices 23.

When the distribution feeder comprises both controllable real and reactive power resources, synchrophasers 20 (otherwise known as phasor measurement units (PMU)) are installed at each node 17 and measure the actual voltage magnitude |V| and the actual voltage angle δ at every location that is monitored. The synchrophasers 20 are communicative with the server computer 12 via the network 19.

The server computer 12 is a redundant server computer system, equipped with a reliable operating system such as Linux, real time software, and a long-term database. The server computer 12 is desirably installed at a secure location, protected from unauthorized physical access, where there is a reliable connection to the internet and a backed-up supply of electricity. The server computer 12 may be a system that is spread across multiple hardware chassis either to aggregate sufficient processing capability, or to provide redundancy in the event of failure, or both. One chassis can operate as the primary server computer 12, and another as a backup server computer 12. Each chassis can run a multi-core capable operating system.

According to alternative embodiment (not shown), the local power control system 10 comprises controllers 14 for controlling reactive power resources but does not comprise controllers for controlling real power resources. As will be explained in detail below, each reactive power resource controller 14 receives target voltage phasor set-points from the server computer 12, and is programmed to operate the reactive power resource 16 at a set-point that causes the actual voltage magnitude at the node site 17 to be moved towards a target voltage magnitude set point provided by the target voltage phasor. Since this alternative embodiment does not involve controlling real power resources, the phase angle along the distribution line is not controlled, and it is thus not necessary to use synchrophasors to measure the actual phase angle at each node.

Instead, any voltage measuring means such as voltmeters (not shown) can be used to measure the actual voltage magnitude at each node. Notably, by controlling the reactive power, it is possible to influence the phase angle difference in a system that has an X/R ratio of line impedance of around 1.

Power Delivery Control Program

The server computer 12 has a processor and a memory on which is stored a power delivery control program which when executed by the processor controls the utility voltage management devices 23 and at least the reactive power resources 16 to deliver a required amount of reactive power to the feeder 11 to bring the voltage to acceptable levels, while minimizing the power loss. The server computer 12 drives the real power resource controllers 13, which then controls real power resources 15 ("direct local control"). Additionally, the power delivery control program can be configured to minimize the operation of the utility voltage management devices 23 and in particular, the substation tap changer.

The power delivery control program uses OPF algorithms that are based on a closed form solution for radial distribution systems. Such a closed form solution is expected to be more computationally tractable than complex generic algorithms which tend to be relatively computationally demanding; as a result, the power delivery control program is expected to be able to react more quickly to changes in the distribution feeder than a program executing complex optimization problems, which is desirable for distribution feeders containing intermittent generation sources such as solar and wind power generators.

An embodiment of the closed form solution used by the power delivery control program to set the target phasor for each node will now be described. This embodiment assumes a balanced, radial distribution system that can be reduced to a single-phase system. This embodiment is expressed in polar form, and allows for a variable ratio of reactive power injection at each of the upstream and downstream nodes i,j.

Figure 2:
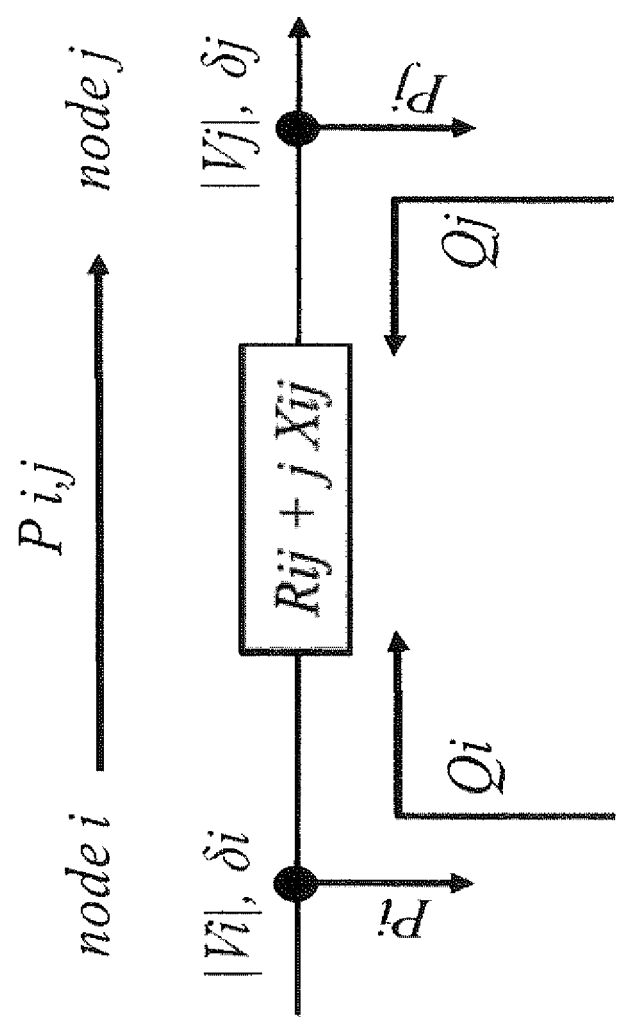
FIG. 2 is a schematic illustration of a feeder segment and two adjacent nodes of the distribution feeder.

Referring to FIG. 2, each feeder segment extends from an upstream node i to a downstream node j individually, and assumes that the shunt capacitance can be neglected. The voltage phasor at sending end $V_{ij}$, the line current phasor $I_{ij}$ and the line admittance $Y_{ij}$ comprising admittance $G_{ij}+j B_{ij}$, are defined as follows:

$$V_i = |V_i| \angle \delta_i \quad (3)$$

$$V_j = |V_j| \angle \delta_j \quad (4)$$

$$I_{ij} = |I_{ij}| \angle \delta_{I_{ij}} \quad (5)$$

$$Y_{ij} = G_{ij} + jB_{ij} = \frac{1}{R_{ij} + jX_{ij}} \quad (6)$$

wherein $\delta_i$ is the phase angle at node i, $\delta_j$ is the phase angle at node j, and $\delta_{I_{ij}}$ is the phase angle of the line current in the line segment ij.

The current ($I_{ij}$) in the feeder segment is defined as:

$$I_{ij} = (V_i - V_j)Y_{ij} = \frac{P_{ij} - jQ_{ij}}{V_i^*} \quad (7)$$

where $V_i$ and $V_j$ are the voltage phasors at sending and receiving end and $Y_{ij}$ is the line admittance, $P_{ij}$ is the real power flow from node i to node j and $Q_{ij}$ is the reactive power flow from node i to node j.

$P_{ij}$ in the feeder segment is expressed in equation (8) as:

$$P_{ij} = \text{Re}\{((V_i - V_j)(Y_{ij}))^* V_i\} \quad (8)$$

The power loss $P_{loss\ ij}$ in the feeder segment is:

$$P_{loss\ ij} = R_{ij}|I_{ij}|^2 = R_{ij}\left|\frac{P_{ij} - jQ_{ij}}{V_i^*}\right|^2 \quad (9)$$

The voltage drop from node i to node j $\Delta V_{ij}$ as defined in equation (10) is:

$$\Delta V_{ij} = V_i - V_j = \frac{R_{ij}P_{ij} + X_{ij}Q_{ij}}{V_i^*} + j\frac{X_{ij}P_{ij} + R_{ij}Q_{ij}}{V_i^*} \quad (10)$$

If $P_{ij} \gg Q_{ij1}$ in (8) and (9), these equations reduce to equations (11) and (12):

$$P_{loss\ ij} = R_{ij}\left|\frac{P_{ij}}{V_i^*}\right|^2 \quad (11)$$

$$\Delta V_{ij} = \frac{R_{ij}P_{ij}}{V_i^*} + j\frac{X_{ij}P_{ij}}{V_i^*} \quad (12)$$

Equations (11) and (12) suggest that reducing the reactance flow $Q_{ij}$ from node i to node j significantly decreases the power loss $P_{loss\ ij}$ and the voltage drop $\Delta V_{ij}$, for equal $P_{ij}$. In the proposed closed form solution, the goal is to drive the voltage at the receiving end $V_j$ to prevent reactive power flow $Q_{ij}$ in the feeder segment while maintaining real power flow $P_{ij}$ through the feeder segment. The consumed reactive power by the line ($Q_{line} = |I_{ij}|^2 X_{ij}$) will be supplied from the two adjacent nodes according to equation (13):

$$aQ_{ij} = Q_{ji} = \frac{Q_{line}}{a+1} \quad (13)$$

where a is the ratio between the reactive power supply from the sending end $Q_{ij}$ and receiving end $Q_{ji}$ ("Q-ratio"). The two conditions lead to equations (27) where $P_{ij}$ is the real power flow before optimization that shall be maintained and therefore is a constant obtained by equation (8):

$$\begin{cases} aQ_{ij} = Q_{ji} \\ P_{ij\ new} = P_{ij} \end{cases} \quad (14)$$

Using the equation for complex power (S=VI*), equation (15) can be formulated:

$$\begin{cases} a \cdot \text{Im}(V_i I_{ij}^*) = \text{Im}(V_j(-I_{ij})^*) \\ \text{Re}(V_i I_i^*) = P_{ij} \end{cases} \quad (15)$$

Substituting equations (3), (4) (5) in (14) and rearranging yields equation (16) with unknown $|V_j|$:

$$\frac{\left(P + G_{ij}\left(\frac{(Vi^2 a - Vj^2)B_{ij}^2 - G_{ij}(P - G_{ij}Vi^2)(a+1)}{(a-1)B_{ij}^2 + (a+1)G_{ij}^2} - Vi^2\right)\right)^2}{B_{ij}^2} -$$

$$\left(\frac{(Vi^2 a - Vj^2)B_{ij}^2 - G_{ij}(P - G_{ij}Vi^2)(a+1)}{(a-1)B_{ij}^2 + (a+1)G_{ij}^2}\right)^2 - Vi^2 Vj^2 = 0$$

(16)

wherein each reference to "G", "P", "B" in equation (16) respectively means "$G_{ij}$", "$P_{ij}$" and "$B_{ij}$"

From equation (16), the voltage magnitude at the receiving end $|V_j|$, can be expressed as a function of the voltage magnitude at sending end $|V_i|$, the line admittance $G_{ij}$, $B_{ij}$ and power flow from node i to node j $P_{ij}$ and Q-ratio a to produce equation (17):

$$|V_j| = f(V_i, G_{ij}, B_{ij}, P_{ij}, a) \quad (17)$$

Similarly, the voltage phase angle at receiving end $\delta_j$ can be expressed as a function of the voltage magnitude at sending and receiving end $|V_i|$, $|V_j|$, the line impedance $G_{ij}$, $B_{ij}$, and phase angle at sending end $\delta_i$ and Q-ratio α to produce equation (18):

$$\delta_j = f(|V_i|, |j|, G_{ij}, B_{ij}, \delta i, a) \quad (18)$$

Solving equation (16) leads to a closed form solution for $|V_j|$ in equation (19) and $\delta_j$ in equation (20):

$$V_j = \sqrt{\frac{\begin{array}{c} B_{ij}^2 M - G_{ij}^2 M + B_{ij}^4 V_i^2 + G_{ij}^4 V_i^2 - B_{ij}^2 aM - \\ G_{ij}^2 aM + 2G_{ij}^2 V_i^2 a + 2B_{ij}^2 G_{ij}^2 V_i^2 + B_{ij}^4 V_i^2 a^2 + \\ G_{ij}^4 V_i^2 a - 4B_{ij}^2 G_{ij} P_{ij} + 2B_{ij}^2 G_{ij}^2 V_i^2 a^2 + 2B_{ij}^2 G_{ij}^2 V_i^2 a \end{array}}{2B_{ij}^4 + 2B_{ij}^2 G^2}}$$

where $$M = \sqrt{\begin{array}{c}(B_{ij}^2 V_i^2 + G_{ij}^2 V_i^2 - 2B_{ij}P_{ij} + B_{ij}^2 V_i^2 a + G_{ij}^2 V_i^2 a) \\ (B_{ij}^2 V_i^2 + G_{ij}^2 V_i^2 + 2B_{ij}P_{ij} + B_{ij}^2 V_i^2 a + G_{ij}^2 V_i^2 a)\end{array}} \quad (19)$$

$$\delta_j = \delta_j - \cos^{-1}\left(\frac{(aV_i^2 - V_j^2)B_{ij}^2 - G_{ij}(P - G_{ij}V_i^2)(a+1)}{V_i V_j((a-1)B_{ij}^2 + (a+1)G_{ij}^2)}\right) \quad (20)$$

Equations (19) and (20) provide a target voltage phasor at the receiving end of a feeder segment that assures that there is no Q flow while the real power flow $P_{ij}$ is maintained with respect to a given sending end voltage phasor $V_i$.

For a radial distribution system, the OPF solution provided in equations (19), (20) at each node can be calculated starting from the substation, successively node by node downstream to the feeder end. The advantage of the proposed closed-form OPF is its fast computation and that it does not require iterative power flow algorithms. Furthermore it works for bi-directional power flow.

System Operation

As will be discussed in more detail below, the power delivery control program controls the voltage magnitude along the distribution feeder by controlling the operation of the reactive power resources 16 and the utility voltage management devices 23 (collectively "voltage management devices") and optionally controls the phase angle δ along the feeder by controlling the operation of the real power resources 15. Generally, the voltage magnitude between two adjacent nodes is similar, and the phase angle difference will generally be small. Executing the power delivery control program will determine the target phasor (voltage magnitude and phase angle) at each node that is required to deliver power to the distribution feeder at minimized feeder power loss.

The power control program can optionally include a voltage management device optimization module that can preferentially select certain voltage management devices over others, by assigning an operating cost to each voltage management device. For example, the voltage management device optimization module can optionally assign a relatively high operating cost to the substation tap changer 23 compared to the reactive power resources 16 in order to minimize the use of the tap changer 23 when controlling the voltage magnitude at each node 17 along the feeder 11. The power delivery control program can also optionally include a load resource management module which comprises program code for determining which process load resources 15 are available to provide power control, and also to select a cost-effective combination of available process load resources 15 to provide this control.

Figure 3:
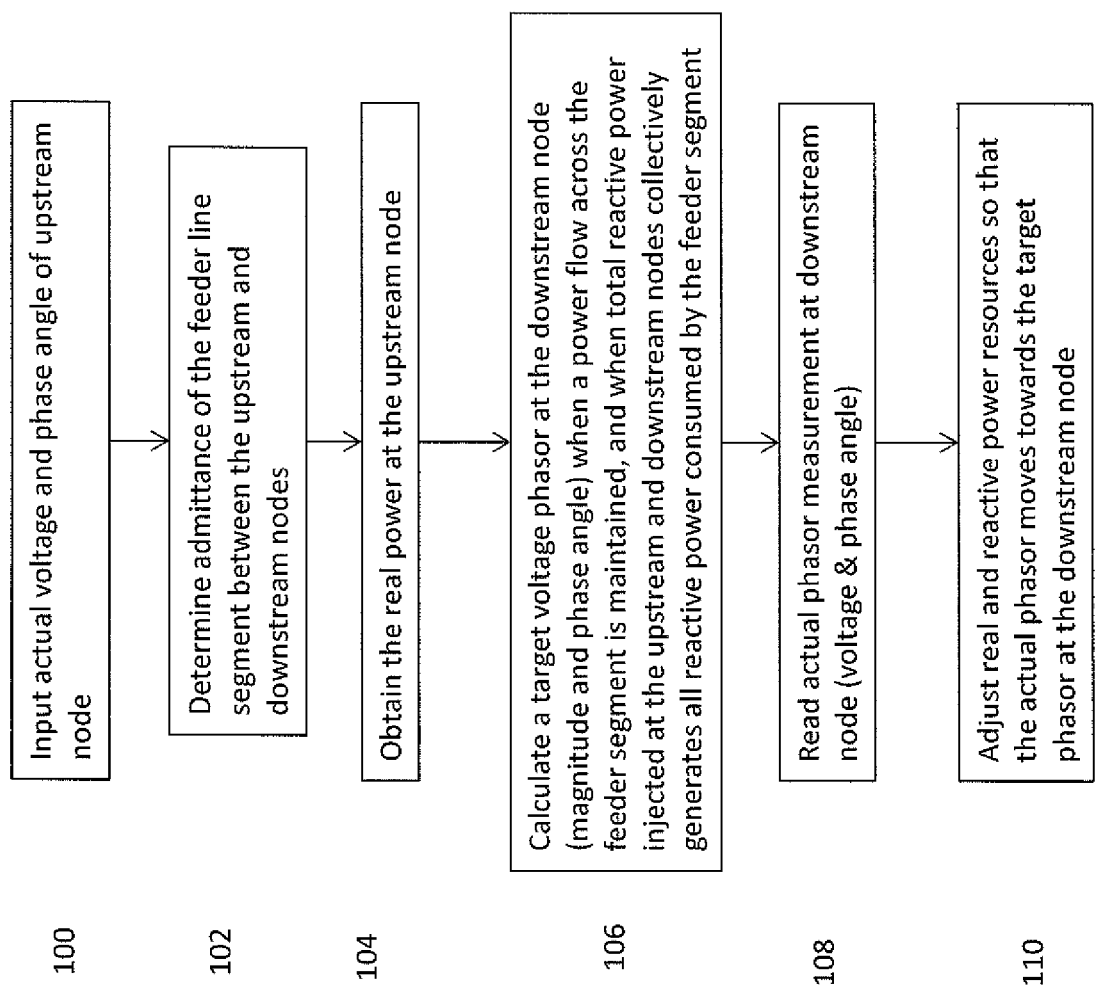
FIG. 3 is a flowchart illustrating execution of a distributed power delivery control program on the central server computer to generate target phasor instructions for each controlled node on the distribution feeder according to a first embodiment.

FIG. 3 is a flowchart illustrating a method for locally controlling delivery of electrical power along a distribution feeder 11 using a system 10 that executes the power delivery control program based on an embodiment wherein equal reactive power is injected at each node to consume all the reactive power in the feeder segment. The system 10 comprises controllers 13, 14 for controlling both controllable real and reactive power resources on the distribution feeder 11.

As noted above, the power delivery control program calculates the target voltage phasor for the downstream node 17 in each feeder segment of the feeder distribution line 11 in succession, starting from the known voltage phasor at the substation 23 and working downstream one feeder segment at a time (the phase angle at the substation is defined to be at angle zero). Thus, the first feeder segment in the distribution line 11 uses the voltage phasor at the substation 23 as the input values for the real and imaginary parts of the voltage at the upstream node $v_{ire}, v_{iim}$ (step 100)

The power delivery control program is provided with or determines the admittance value $Y_{ij}$ of the feeder segment (step 102). The admittance can be determined from the known resistance and reactance of the feeder segment.

The real power at the upstream node i can be measured through its syncrophasor 20 using equation (5) for a feeder segment from node i to node j when line impedance is known (step 104). Alternatively, the real power value at the upstream node i is obtained by means known in the art, e.g. a wattmeter or state estimation. As noted above, this value is input into the power delivery control program as the power flow $P_{ij}$ across the feeder segment.

The inputted real and imaginary parts of the voltage at the upstream node $v_{ire}, v_{iim}$, the determined admittance value $Y_{ij}$ and the measured power flow value $P_{ij}$ are used by the power delivery control program in equations (12) and (13) to solve for the real and imaginary parts of the voltage at the downstream node $v_{jre}, v_{jim}$. The target voltage phasor (comprising the target voltage magnitude and phase angle) at the downstream node is then determined by solving equations (14) and (15) (step 106).

The synchrophasor 20 at the downstream node 17 of the feeder segment is read to obtain measurements of the actual phasor at the downstream node 17 (step 108). The actual phasor measurements consists of the voltage magnitude |V| and angle δ at the downstream node 17. The real and/or reactive power controllers 13, 14 at the downstream node receive their target voltage phasor from the power delivery control program, and receive the actual voltage phasor measurements from the syncrophasor 20. With these inputs, the real and/or reactive power controllers 13, 14 can determine the difference between the actual voltage magnitude and phase angle and the target voltage angle and phase angle.

The real and/or reactive power controllers 13, 14 then selects one or more real and/or reactive power resources 15, 16 to control to cause the actual voltage magnitude and phase angle at the downstream node to move towards its target voltage magnitude and phase angle, then operates their selected real and/or reactive power resources 15, 16 accordingly (step 110). As noted previously, the controllable reactive power resources 16 at node sites 17 can be used to control the reactive power injection at each node 17 and the substation. As is well understood by those skilled in the art, reactive power resources 16 such as capacitors increase reactive power and consequently increase voltage magnitude at a node 17 and can be selected when the actual voltage magnitude is lower than the target voltage magnitude. Conversely, reactive power resources 16 that consume reactive power and consequently decrease voltage magnitude at a node 17 can be selected when the actual voltage magnitude is higher than the target voltage magnitude; examples of such reactive power resources include PV inverters and static synchronous compensators (STATSCOMs), which can be operated in inductive mode to lower the voltage as required.

The above steps are repeated for each line segment between two nodes along the entire distribution feeder 11. For the first line segment, the reference voltage at the upstream node will be the voltage phasor at the substation 23. Applying steps 100 to 110 will provide a voltage target at the downstream node (first node 17 after the substation 23). For the second line segment, the voltage phasor at the upstream node will be the target voltage phasor at the downstream node of the first line segment. This sequence is repeated for each feeder segment until the last node is reached within the distribution feeder 11.

Figure 4:
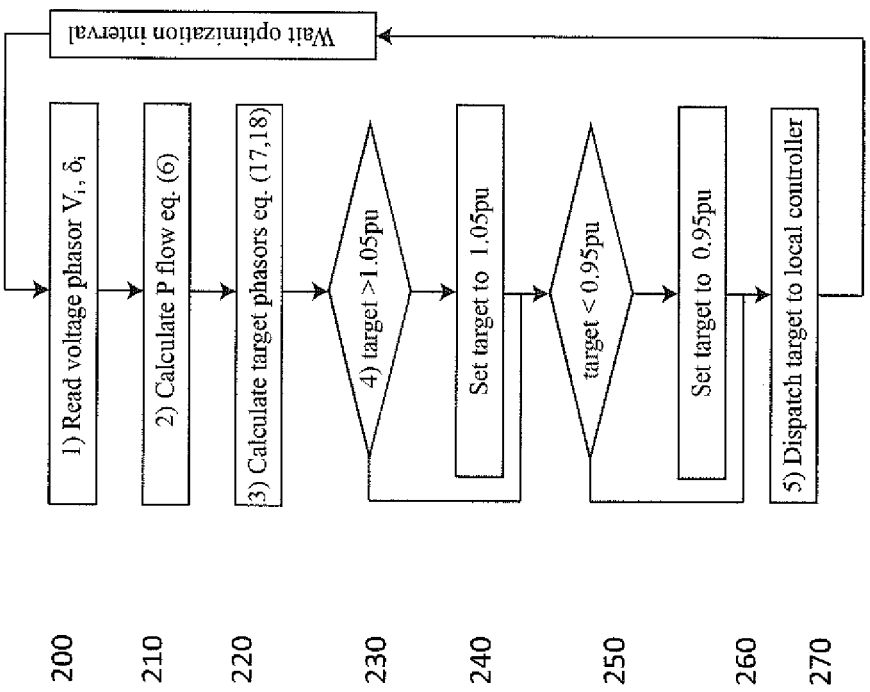
FIG. 4 is a flowchart illustrating execution of a distributed power delivery control program on the central server computer to generate target phasor instructions for each controlled node on the distribution feeder according to a second embodiment.

FIG. 4 is a flowchart illustrating a method for locally controlling delivery of electrical power along a distribution feeder 11 using a system 10 that executes the power delivery control program based on another embodiment of the closed-form solution, which is implemented in the central control server within a repeated routine. The central control server 1) obtains voltage phasors $V_i$ and $V_j$ at the upstream and downstream nodes using the syncrophasors 20 at each node i, j (step 200); 2) determines the admittance of the feeder $Y_{ij}$ then calculates the actual power flow $P_{ij}$ through each feeder segment using equation (21) (step 210); 3) determines the line admittance values $B_{ij}$ and $G_{ij}$ then calculates the target voltage phasor of the downstream node j using the closed-form equations (32, 33) (step 220); 4) ensures that target phasor is within the voltage limits of 0.95 and 1.05 pu (steps 230-260) and 5) dispatches target voltage phasor to the distributed controller at the downstream node (step 270). This routine is repeated continually for each successive pair of adjacent nodes.

In some embodiments, the real and/or reactive power resources 15, 16 do not have any operational constraints, and the power delivery control program should be able to control the power delivery along the feeder segment with a minimum power loss. In other embodiments, the real and/or reactive power resources can be provided with operational constraints. For example, an operational constraint can be assigned that represents the maximum available reactive power resources. If the maximum available reactive power resources are not sufficient to track the voltage phasor targets, a new set of target voltage phasors for the entire feeder line should be computed considering the reactive power constraints. In another example, an operational constraint can be assigned that represents a maximum threshold on the line current in each segment, as the feeders have a maximum current constraint.

Optionally, the voltage management device optimization module can be executed to select a cost effective combination of voltage management devices 16, 23 that will be used to meet the target voltage magnitude at each node. The voltage management device optimization module determines which voltage management devices 16, 23 are available to achieve the target voltage magnitudes at each node 17, selects a cost effective combination of available voltage management devices 16, 23, then sends control signals to controllers of those selected voltage management devices 16, 23 to operate those devices accordingly. The selected combination can be the combination that provides the lowest operating cost, or any one of a number of combinations which have an operating cost below a selected threshold. Because not all nodes 17 may have a reactive power resource 16 that can be controlled by the system 10, it may not be possible to achieve the target voltage magnitudes at each node 17, in which case, the power delivery control program selects the available reactive power resources 16, 23 to come as close as possible to the target voltage magnitude.

In some embodiments, a feeder node may not have a reactive power resource that can be controlled, or the reactive power resource 16 at a node is not sufficient to bring the actual voltage magnitude into an allowable range or the target voltage magnitude. In this situation, the apparatus 10 may select the tap changer 23 at the substation to contribute to meeting the target voltage magnitude at the node 17. However, because frequent use of the substation tap changer 23 is generally undesirable, the voltage management device optimization module assigns a comparatively higher operating cost to using the utility voltage management devices 23 and a comparatively lower operating cost to using the reactive power resources 16 at the node sites 17. The cost function for each reactive device 16, 23 is assigned based on actual cost. For example, a smart inverter can react quickly with little cost, and as a result is assigned a relatively low operating cost. Conversely, resources such as transformer tap changers that have life limits based on operations, are assigned a relatively high operating cost. Once the operating cost is assigned to each voltage management device 16, 23, a costing subroutine is executed to determine the available voltage management devices 16, 23 and their respective voltage settings.

Optionally, each real power controller 14 can include a power delivery control program that executes a process load resource management module to select a cost effective combination of real power resources 15 that will be used to meet the target phase angle at each node 17. As noted previously, the real power resources 15 include controllable process load resources 15 that serve a primary process, and can be used by the system 10 to control phase angles along the feeder 11 provided that the usage does not exceed the operational constraints dictated by the load resource's primary process. The use and selection of such process load resources 15 to provide load is disclosed in co-owned PCT application publication no. WO 2011/085477, and is hereby incorporated by reference.

The process load resource management module includes program code which determines which process load resources 15 are the most cost-effective to operate at any given time, then selects those process load resources 15 to meet the target phasor angle at each node 17 along the feeder. In order to determine the relative cost to operate a process load resource 15 at a particular point in time, the site control module programming includes a costing sub-routine which attributes a cost for operating each process load resource 15 at a particular point in time. The costing subroutine takes into consideration factors such as the cost that must be paid to the primary process operator for using the resource 15 at that time instance. The aggregated cost is then multiplied by a risk factor allocated to each resource 15 at that time instance; this risk factor takes into consideration the risk that over the period of time the resource 16 will be used to provide power delivery control, the primary process operator will override feeder power control and use the resource 15 for its primary purpose. The costing sub-routine then selects a cost effective combination of process load resources to be operated; a cost effective combination can be the combination of on-line load resources having the lowest operational cost, or any one of a combination of load resources which fall within a defined operational cost budget.

Once the real power resources 15 and the reactive power resources 16 are selected, the system 10 transmits a control signal to the controller 13, 14 at each real and reactive power resource 15, 16 that contains the target phasor for the node of the real and reactive power resource 15, 16. The controllers 13, 14 then operate their associated real and reactive power resource 15, 16 to achieve the target phasor. That is, the load resource controller 13 will increase the load of its load resource when the measured phase angle at the node is lower than the target phase angle, and decrease the load when the measured phase angle is higher than the target phase angle. The reactive power resource controller 14 will engage a reactive power resource 15 to generate reactive power at a node 17 when the measured voltage magnitude at the node is below the target voltage magnitude, and will engage a reactive power resource 15 to consume reactive power at a node 17 when the measured voltage magnitude at the node 17 is above the target voltage magnitude. In this manner, the system 10 can provide localized control of the delivery of power to each node 17 along the feeder 11, at a desirably low feeder power loss, while keeping the substation tap changer operation at a minimum (assuming the tap changer 23 is assigned a relatively high operational cost).

Alternatively, the real power resources 15 can include generation resources, in which case, a process generation resource management module is provided to select the generation resource that will be used to meet the target phase angle at each node. Like the load resources, the generation resources can include resources which serve a primary process, in which case the system only controls those generation resources that are on-line, i.e. within the operational constraints of their primary process. In a manner similar to selecting a cost-effective combination of load resources, a costing sub-routine is executed and each available generation resource is assigned a relative operating cost, and the most cost-effective combination of generation resources is selected to meet the target phasor angle at each node along the feeder. Once the generation resources are selected, the system 10 sends a control signal to each controller of the selected generation resource that contains the target phasor for the node of the generation resource. The controllers then operate their associated generation resource to achieve the target phasor. That is, the generation resource controller will increase the generation of its load resource when the measured phase angle at the node is higher than the target phase angle, and decrease the generation when the measured phase angle is lower than the target phase angle.

According to another embodiment, the system is configured to only control the voltage magnitude along the distribution feeder. In this case, the power deliver control program when executed only instructions to the reactive power resource controllers to control the operation of the reactive power resources, such that the actual voltage magnitude at each node is moved towards the target voltage magnitude of the target voltage phasor determined by the power delivery control program.

While particular embodiments have been described in the foregoing, it is to be understood that other embodiments are possible. It will be clear to any person skilled in the art that modifications of and adjustments to this invention, not shown, are possible as demonstrated through the exemplary embodiment.

What is claimed is:

1. A method for locally controlling delivery of electrical power along a distribution feeder of an electricity grid, the distribution feeder comprising a substation and a plurality of nodes, and the plurality of nodes comprising at least one controllable reactive power resource, the method comprising, for a feeder segment in the distribution feeder:
   (a) obtaining an actual voltage magnitude at an upstream node and at a downstream node of the feeder segment, and a real power value at the upstream node;
   (b) setting a target voltage phasor at the downstream node as a value when a power flow across the feeder segment is maintained, and when total reactive power injected at the upstream and downstream nodes collectively generates all reactive power consumed by the feeder segment; and
   (c) adjusting operation of the at least one controllable reactive power resource so that the actual voltage magnitude at the downstream node moves towards a target voltage magnitude of the target voltage phasor.

2. The method as claimed in claim 1 wherein the actual voltage magnitude at the upstream and downstream nodes is obtained by measuring at the feeder segment.

3. The method as claimed in claim 2 wherein the actual voltage magnitude is obtained from a synchrophasor at the upstream and downstream nodes.

4. The method as claimed in claim 3 wherein the plurality of nodes for each feeder segment comprises at least one controllable real power resource and the method further comprises:
   measuring an actual voltage phasor value at the upstream and downstream nodes of the feeder segment, wherein the actual voltage phasor value at the upstream and downstream nodes includes an actual voltage magnitude and an actual phase angle relative to the substation, and
   adjusting operation of the at least one controllable real power resource so that the actual phase angle at the downstream node moves towards a target phase angle of the target voltage phasor.

5. The method as claimed in claim 1 wherein the adjusting operation of the at least one controllable reactive power resource comprises using a reactive power device that increases reactive power to increase the actual voltage magnitude and using a reactive power device that decreases reactive power to decrease the actual voltage magnitude.

6. The method as claimed in claim 1 wherein the plurality of nodes include a third node having an intermittent power generation source, and the method further comprises adjusting the value of the target voltage phasor at each node after a change in power generation from the intermittent power generation source.

7. The method as claimed in claim 1 wherein the reactive power injected at each of the upstream and downstream nodes are equal.

8. A system for locally controlling delivery of electrical power along a distribution feeder of an electricity grid, the distribution feeder comprising a substation and a plurality of nodes, wherein a pair of adjacent nodes define a feeder segment of the distribution feeder and the feeder segment comprises at least one controllable reactive power resource, the system comprising:
   (a) at least one reactive power resource controller communicative with and programmed to control operation of the at least one controllable reactive power resource;
   (b) a server computer communicative with the at least one reactive power resource controller, and comprising a processor and a memory having encoded thereon program code executable by the processor to:
      (i) receive an actual voltage magnitude at an upstream node and at a downstream node of the feeder segment, and a real power value at the upstream node;
      (ii) set a target voltage phasor at the downstream node as a value when a power flow across the feeder segment is maintained, and when total reactive power injected at the upstream and downstream nodes collectively generates all reactive power consumed by the feeder segment; and
      (iii) transmit the target voltage phasor to the at least one reactive power resource controller, such that the at least one reactive power resource controller operates the at least one controllable reactive power resource so that the actual voltage magnitude at the downstream node moves towards a target voltage magnitude of the target voltage phasor.

9. The system as claimed in claim 8 wherein the feeder segment further comprises at least one controllable real power resource, and the system further comprises
   at least one real power resource controller communicative with and programmed to control operation of the at least one controllable real power resource;
   and wherein the server computer is communicative with the at least one real power resource controller and the memory is further encoded with program code executable by the processor to:
   receive an actual voltage phasor value at the upstream and downstream nodes of the feeder segment, wherein the actual voltage phasor value at the upstream and downstream nodes includes an actual voltage magnitude and an actual phase angle relative to the substation, and
   transmit the target voltage phasor to the at least one real power resource controller, such that the at least one real power resource controller operates the at least one controllable real power resource so that the actual phase angle at the downstream node moves towards a target phase angle of the target voltage phasor.

10. The system as claimed in claim 9 further comprising at least one synchrophasor for measuring the actual voltage phasor value at each node and which is communicative with the server computer to transmit a measured actual voltage phasor value to the server computer.

11. The system as claimed in claim 8 wherein the at least one controllable reactive power resource is selected from a group consisting of: a capacitor for generating reactive power, a solar inverter, and a static synchronous compensators for providing reactive power.

12. The system as claimed in claim 9 wherein the at least one controllable real power resource is selected from a group consisting of: an electrical generator for generating real power, electrically-powered devices for consuming real power, and an electrical storage device for storing and releasing electrical energy.

\* \* \* \* \*